(12) United States Patent
Takai et al.

(10) Patent No.: US 7,433,978 B2
(45) Date of Patent: Oct. 7, 2008

(54) SEMICONDUCTOR DEVICE FOR TRANSFERRING FIRST DATA TO A SETTING/RESETTING CIRCUIT BLOCK

(75) Inventors: Tomohisa Takai, Kawasaki (JP); Ryo Fukuda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 518 days.

(21) Appl. No.: 11/066,250

(22) Filed: Feb. 28, 2005

(65) Prior Publication Data

US 2006/0048027 A1    Mar. 2, 2006

(30) Foreign Application Priority Data

Sep. 2, 2004   (JP) ............................. 2004-255830

(51) Int. Cl.
*G06F 3/00* (2006.01)
(52) U.S. Cl. ..................... 710/33; 710/52; 710/131; 714/724
(58) Field of Classification Search ............ 710/33, 710/52, 131; 714/724
See application file for complete search history.

(56) References Cited

U.S. PATENT DOCUMENTS 5,461,584 A * 10/1995 Ikuta et al. ................. 327/516

2006/0017668 A1 * 1/2006 Shirasaki et al. .............. 345/76

FOREIGN PATENT DOCUMENTS

JP     2003-110029    4/2003

OTHER PUBLICATIONS

Michael R. Ouellette, et al., "Shared Fuse Macro for Multiple Embedded Memory Devices with Redundancy", IEEE, 2001, 4 Pages.

* cited by examiner

*Primary Examiner*—Tammara R Peyton
(74) *Attorney, Agent, or Firm*—Oblon, Spivak, McClelland, Maier & Neustadt, P.C.

(57) ABSTRACT

A semiconductor device transfers first data to a circuit block. The semiconductor device is provided with a storage circuit configured to store the first data, a shift register configured to set the first data, a transfer circuit configured to transfer the first data from the shift register to the circuit block, a first input terminal configured to receive a first signal indicating the end of a transfer operation, a resetting signal-generating circuit configured to generate a resetting signal for resetting the shift register based on the first signal, a setting signal-generating circuit configured to generate a setting signal for setting the first data in the shift register again after the shift register is reset, and an output circuit configured to externally output the first data that has been set again.

17 Claims, 10 Drawing Sheets

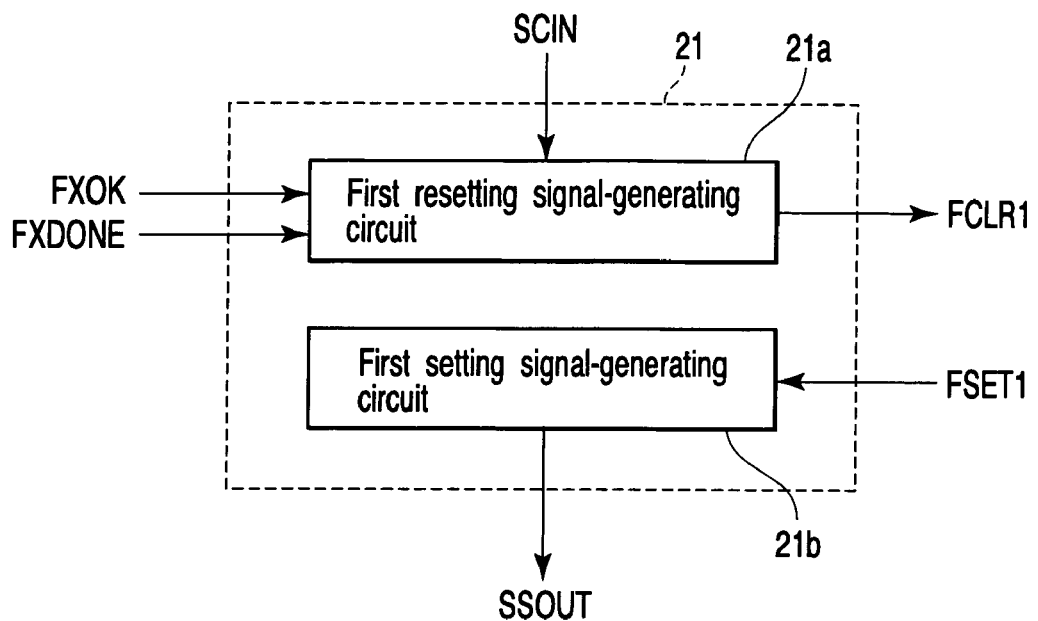
F I G. 1 4
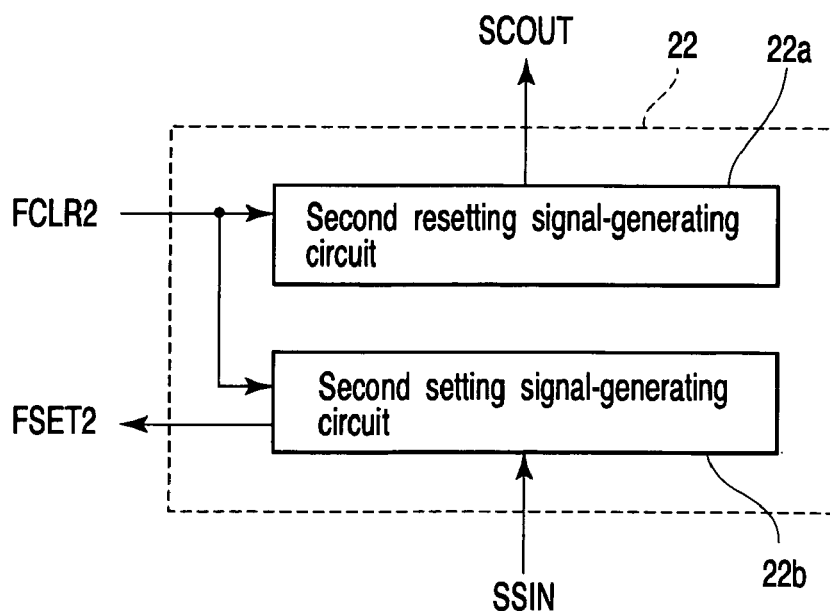
F I G. 1 5

SEMICONDUCTOR DEVICE FOR TRANSFERRING FIRST DATA TO A SETTING/RESETTING CIRCUIT BLOCK

CROSS-REFERENCE TO RELATED APPLICATIONS

This application is based upon and claims the benefit of priority from prior Japanese Patent Application No. 2004-255830, filed Sep. 2, 2004, the entire contents of which are incorporated herein by reference.

BACKGROUND OF THE INVENTION

1. Field of the Invention

The present invention relates to a semiconductor device, more particularly to a semiconductor integrated circuit comprising a circuit block which operates based on initializing data and a circuit which transfers the initializing data.

2. Description of the Related Art

The amount of analog data output from a circuit made up of transistors inevitably varies depending upon the characteristic variation among the transistors. The variation amount of analog data can be corrected to be a predetermined value, and this correction operation is known as "trimming." Redundancy is also known in the art as a technology for remedying defective cells of a memory by use of a redundancy circuit.

To put the trimming or redundancy to practical use, a data distribution circuit is provided to send trimming data based on which the trimming is performed, or redundancy data based on which the redundancy is performed. The data distribution circuit comprises programmable nonvolatile elements for retaining initializing data such as trimming data or redundancy data. It also comprises a shift register made up of flip-flops and configured to store the initializing data. The shift register is made up of flip-flops which are equal in number to the pieces of the initializing data. The data distribution circuit sends the initializing data to a group of circuit blocks located far away. Each circuit block performs trimming and redundancy, using the initializing data it receives.

The above configuration is disadvantageous in the following points: (i) it is not possible to externally confirm whether the initializing data of the nonvolatile elements are correctly set in the shift register, and (ii) it is not possible to externally confirm whether the initializing data are correctly supplied to the circuit blocks. Furthermore, the nonvolatile elements are programmable only once. After the nonvolatile element is programmed, the data used for programming is the only data that is available, and the circuit blocks cannot use data other than the programming data.

When the data of the nonvolatile elements is set in the shift register, the above configuration uses pulse signals. The shift register is made up of a plurality of flip-flops. Where the initializing data have a large data width, the number of flip-flops required is large. Therefore, a plurality of shift registers, each corresponding to a predetermined number of bits, are used, and these shift registers are connected in series to deal with the initializing data. To transmit pulse signals to the multi-stage shift register, a plurality of buffers made up of transistors are used.

Where a plurality of buffers are used for data setting, the characteristic difference among the transistors becomes more marked in accordance with an increase in the number of pieces of data, and the pulse signals may not be transmitted to the final stage with a satisfactory margin. In other words, the characteristic difference among the transistors gives rise to a decrease in the pulse width of the pulse signals. In the worst case, the pulse signals may be lost during the transmission. Owing to this, data may not be set in the shift register of the final stage.

A semiconductor device related to the above art enables external setting of trimming data. Such a semiconductor device is disclosed in Jpn. Pat. Appln. KOKAI Publication No. 2003-110029, for example.

BRIEF SUMMARY OF THE INVENTION

A semiconductor device according to the first aspect of the present invention transfers first data to a circuit block and comprises: a storage circuit configured to store the first data; a shift register configured to set the first data; a transfer circuit configured to transfer the first data from the shift register to the circuit block; a first input terminal configured to receive a first signal indicating the end of a transfer operation; a resetting signal-generating circuit configured to generate a resetting signal for resetting the shift register based on the first signal; a setting signal-generating circuit configured to generate a setting signal for setting the first data in the shift register again after the shift register is reset; and an output circuit configured to externally output the first data that has been set again.

A semiconductor device according to the second aspect of the present invention comprises: an output circuit configured to output a first signal; a transmission circuit including a plurality of circuit sections connected in series, each of the circuit sections including a load capacitance element that operates based on the first signal, and a buffer circuit serving to supply the first signal to subsequent ones of the circuit sections; and a generation circuit configured to generate a pulse signal by inverting the polarity of the first signal after the first signal is transmitted to the circuit sections.

A semiconductor device according to the third aspect of the present invention comprises: a storage circuit configured to store first data; a shift register configured to set or reset the first data; a first resetting signal-generating circuit configured to generate a resetting signal for resetting the shift register; and a second resetting signal-generating circuit configured to generate a first detection signal indicating that the shift register has been reset after the resetting signal is transferred to the shift register, the first resetting signal-generating circuit disabling the resetting signal based on the first detection signal.

BRIEF DESCRIPTION OF THE SEVERAL VIEWS OF THE DRAWING

FIG. 14 is a block diagram showing the configuration of the first control section 21 depicted in FIG. 13.

FIG. 15 is a block diagram showing the configuration of the second control section 22 depicted in FIG. 13.

DETAILED DESCRIPTION OF THE INVENTION

Figure 1:
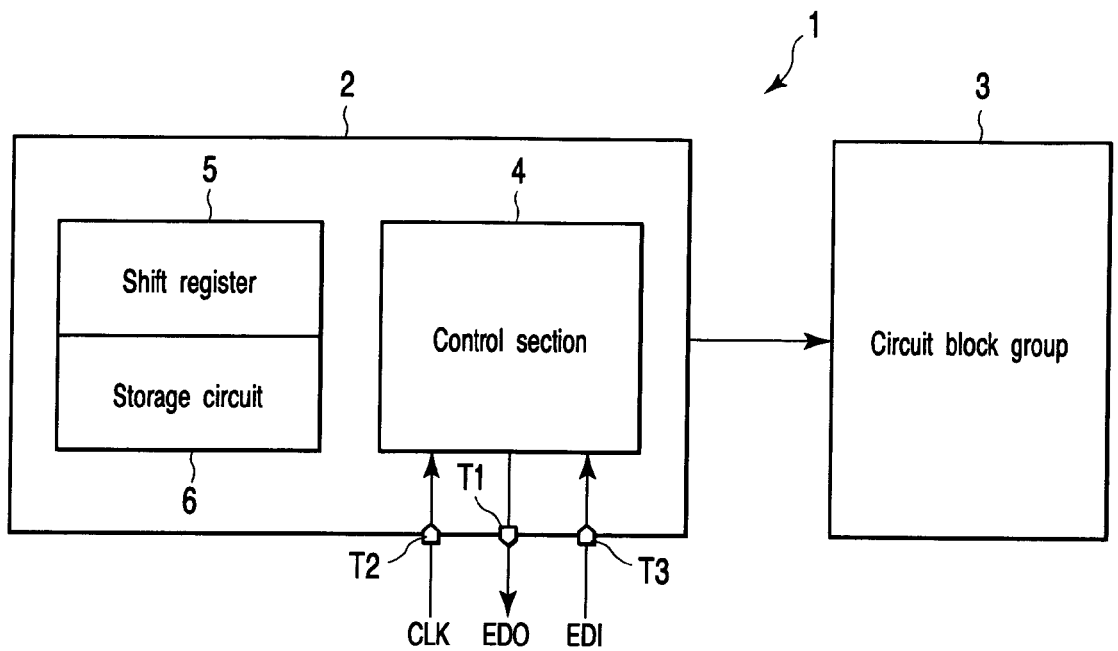
FIG. 1 is a schematic diagram illustrating a semiconductor integrated circuit 1 according to the first embodiment of the present invention.

Embodiments of the present invention will now be described with reference to the accompanying drawings. In the descriptions below, structural elements that are similar or correspond to each other will be denoted by the same reference numerals, and a repeated description will be given only where necessary.

First Embodiment

FIG. 1 is a schematic diagram illustrating a semiconductor integrated circuit 1 according to the first embodiment of the present invention. The semiconductor integrated circuit 1 comprises a data distribution apparatus 2 and a group of circuit blocks 3 (which will be collectively referred to as "circuit block group 3" hereinafter).

The data distribution apparatus 2 has a clock terminal T2. Clock signal CLK is externally supplied to the clock terminal T2. The data distribution apparatus 2 operates in synchronism with the clock signal CLK.

The data distribution apparatus 2 transfers initializing data to the circuit block group 3. The data distribution apparatus 2 includes a control section 4, a shift register 5 and a storage circuit 6.

The storage circuit 6 stores the initializing data. The storage circuit 6 can be programmed only once to store the initializing data. The storage circuit 6 is made up of a plurality of nonvolatile elements (ROM: read only memories), the number of which corresponds to the number of bits of the initializing data.

The shift register 5 sets the initializing data in itself. Specifically, the shift register 5 fetches and holds the initializing data. On the basis of the clock signal CLK, the shift register 5 shifts the initializing data. Then, the shift register 5 sends the initializing data to the circuit block group 3.

Figure 2:
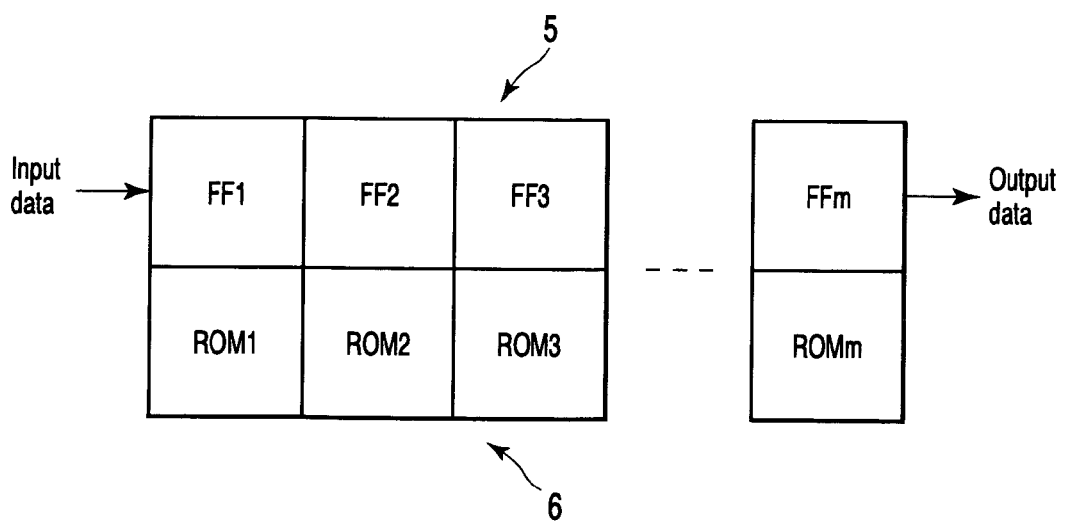
FIG. 2 is a block diagram showing the configurations of the shift register 5 and storage circuit 6 depicted in FIG. 1.

FIG. 2 is a block diagram showing the configurations of the shift register 5 and storage circuit 6 depicted in FIG. 1. The storage circuit 6 includes a plurality of nonvolatile elements ROM1-ROMm, the number of which corresponds to the number of bits of the initialing data. The shift register 5 includes a plurality of flip-flops FF1-FFm. These flip-flops are arranged in correspondence to the nonvolatile elements.

The data stored in the nonvolatile elements are set in the flop-flops FF. The flip-flop FF outputs the set data in synchronism with the clock signal CLK. Furthermore, The flip-flop FF outputs data input from the flip-flop FF adjacent to the input side in synchronism with the clock signal CLK. In this manner, the shift register 5 outputs all data stored in the storage circuit 6. Externally-supplied input data may be set in the flip-flops FF of the shift register 5. After being retained for a predetermined time, the input data is output from the shift register 5.

The control section 4 controls the operation of setting the initializing data in the shift register 5. The control section 4 also controls the operation of transferring the initializing data from the shift register 5 to the circuit block group 3.

The circuit block group 3 is initialized based on the initializing data. The circuit block group 3 includes a reference voltage generating circuit, for example. The reference voltage generating circuit performs a trimming operation on the basis of the initializing data. In other words, the reference voltage generating circuit corrects an output voltage to a predetermined value on the basis of the initializing data (which is trimming data in the example).

The circuit block group 3 may include a semiconductor storage device. The semiconductor storage device has a redundancy circuit and performs a redundancy on the basis of the initializing data. In other words, the semiconductor storage device remedies a defective cell of the memory by use of the redundancy circuit.

The data distribution apparatus 2 has input terminal T3 which enables access to the shift register 5, and output terminal T1 from which data is output. External input data EDI is supplied to input terminal T3. External output data EDO is supplied from output terminal T1.

A description will now be given as to how the semiconductor integrated circuit 1 operates. First of all, the control section 4 sets the data of the storage circuit 6 in the shift register 5. Then, the control section 4 transfers the set data from the shift register 5 to the circuit block group 3. Subsequently, the control circuit 4 resets the shift register 5.

The control circuit 4 sets data in the shift register 5 once again. Upon receipt of clock signal CLK externally supplied thereto, the data is externally output from output terminal T1.

In synchronism with clock signal CLK supplied from input terminal T2, the shift register 5 is supplied with external input data EDI from the input terminal T3. The control circuit 4 sends this data to the circuit block group 3.

Figure 3:
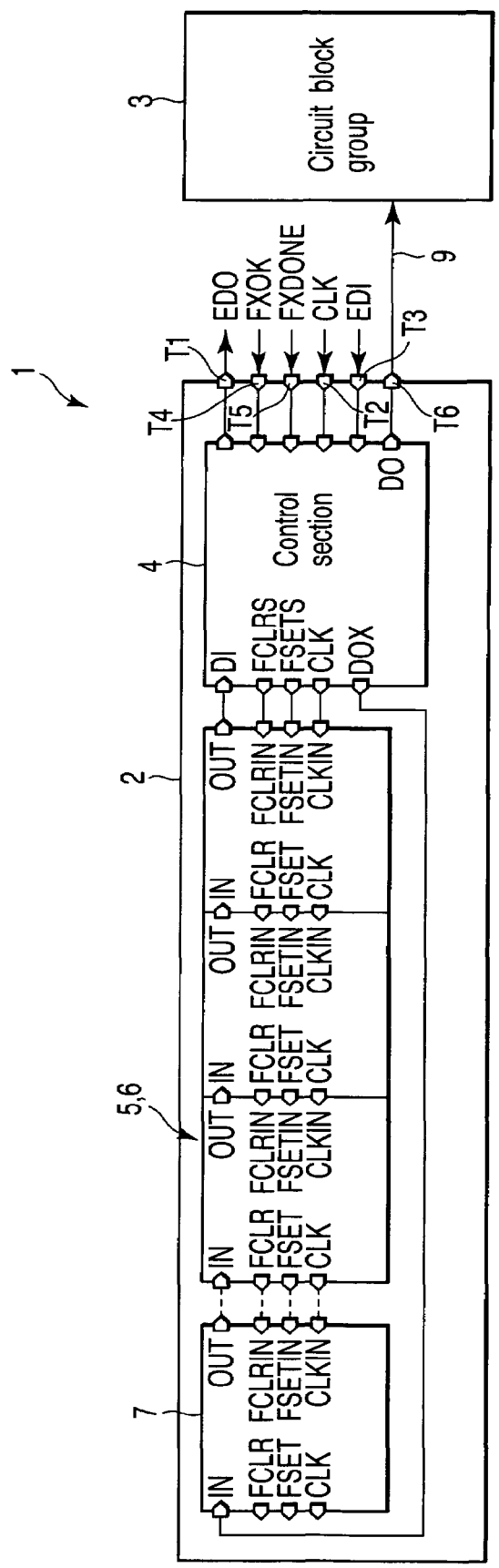
FIG. 3 is a block diagram showing an example of the configuration of the semiconductor integrated circuit 1 depicted in FIG. 1.

The circuit configuration and circuit operation of the semiconductor integrated circuit 1 shown in FIG. 1 will be described in more detail, referring to the drawings. FIG. 3 is a block diagram showing an example of the configuration of the semiconductor integrated circuit 1 depicted in FIG. 1.

The data distribution apparatus 2 and the circuit block group 3 are connected to each other through an input/output signal line 9. The data distribution apparatus 2 has output terminals T1 and T6 and input terminals T2, T3, T4 and T5. Input terminal T2 receives clock signal CLK externally supplied thereto. Input terminal T3 receives external input data EDI externally supplied thereto. Input terminal T3 also receives commands externally supplied thereto.

Input terminal T4 receives a transfer start signal FXOK externally supplied thereto. The transfer start signal FXOK designates the start of the operation of transferring the initializing data. The transfer start signal FXOK is supplied from the control block group 3, from a control circuit controlling this control block group 3, or from another circuit.

Input terminal T5 receives a transfer end signal FXDONE externally supplied thereto. The transfer end signal FXDONE designates the end of the operation of transferring the initializing data. Like the transfer start signal FXOK, the transfer end signal FXDONE is supplied from the control block group 3, from the control circuit controlling the control block group 3, or from another circuit. The signals received at these terminals are supplied to the control section 4 through the terminals of the control section 4.

Output terminal T1 outputs an external output data EDO provided by the control section 4. Output terminal T6 outputs output data DO provided by the control section 4. The output data DO is supplied to the circuit block group 3 through the input/output signal line 9.

Figure 4:
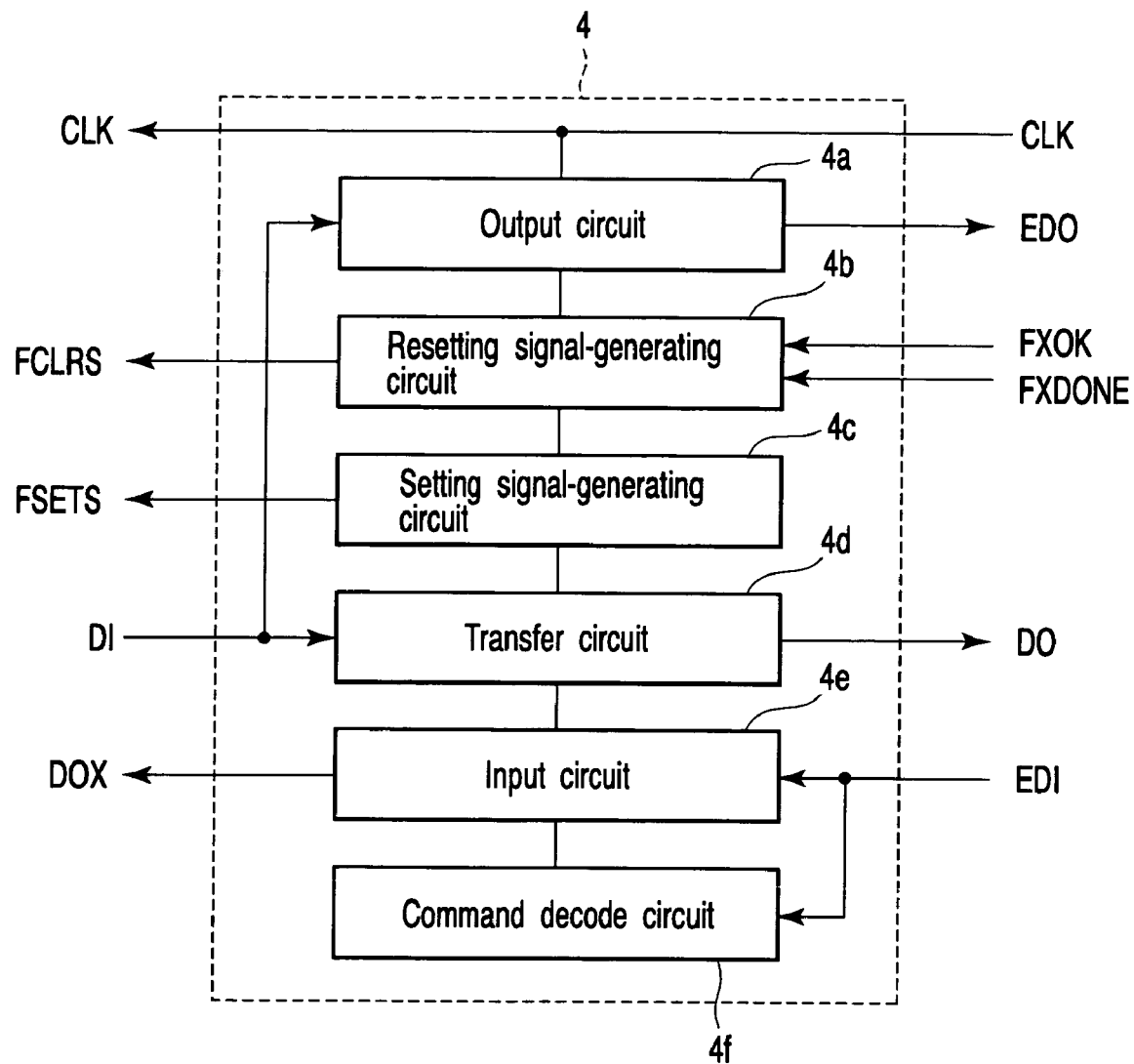
FIG. 4 is a block diagram showing the configuration of the control section 4 depicted in FIG. 3.

FIG. 4 is a block diagram showing the configuration of the control section 4 depicted in FIG. 3. The control section 4 comprises an output circuit 4a, a resetting signal-generating circuit 4b, a setting signal-generating circuit 4c, a transfer circuit 4d, an input circuit 4e and a command decode circuit 4f.

The output circuit 4a outputs data which is set in the shift register 5 again. The resetting signal-generating circuit 4b generates a resetting signal FCLRS used for resetting the shift register 5 or for releasing it from the reset state. To be more specific, the resetting signal-generating circuit 4b generates a signal FCLRS used for reset-releasing, upon reception of signal FXOK, and generates the signal FCLRS used for resetting, upon reception of signal FXDONE.

The setting signal-generating circuit 4c generates a setting signal FSETS used for setting data in the shift register 5. To be more specific, the setting signal-generating circuit 4c generates the setting signal FSETS after the shift register 5 is released from the reset state. The transfer circuit 4d transfers data from the shift register 5 to the circuit block group 3.

The input circuit 4e receives external input data EDI, which is externally supplied thereto. The input circuit 4e supplies the external input data EDI to the shift register 5. The command decode circuit 4f interprets the command supplied to the input terminal T3. Based on the command, the command decode circuit 4f controls the circuits of the control section 4. The clock signal CLK input to the control section 4 is supplied to the circuits provided in the control section 4. The clock signal CLK is supplied from the control section 4 to the shift register 5.

Figure 5:
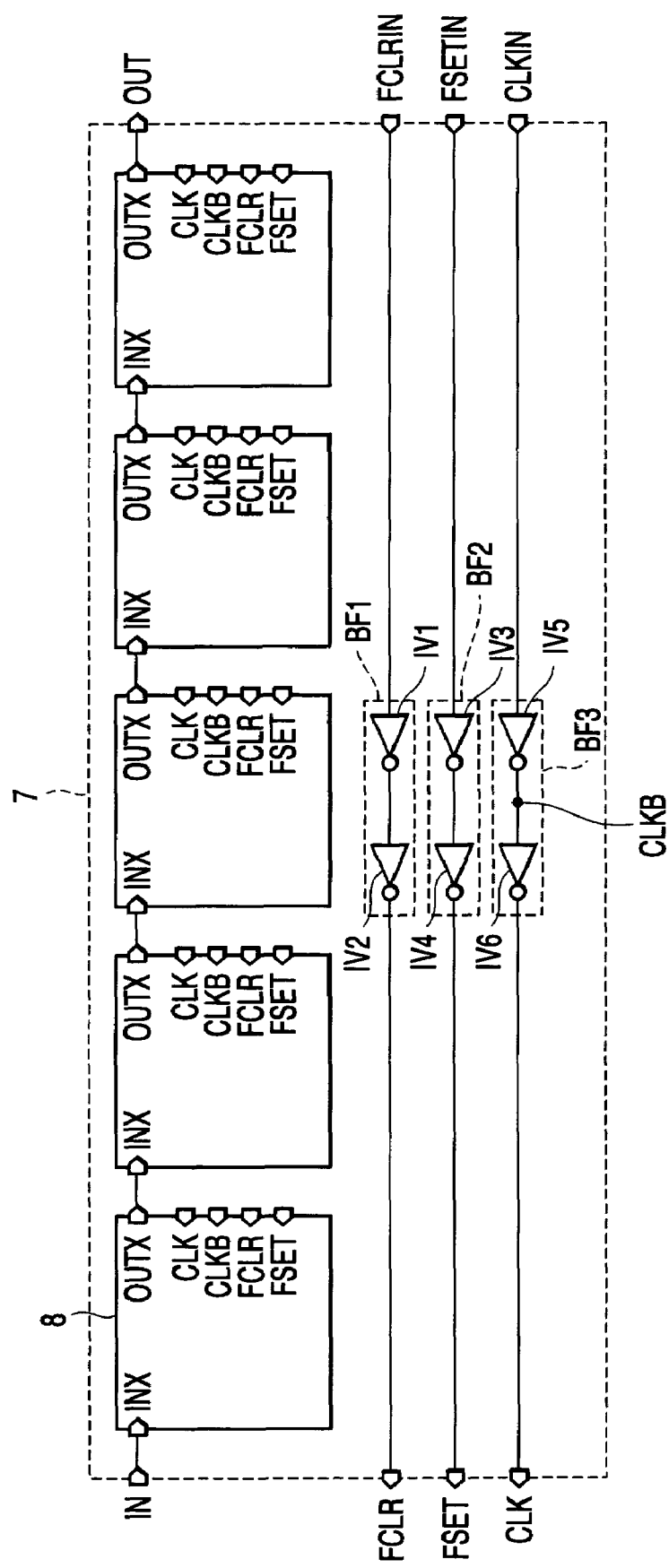
FIG. 5 is a circuit block diagram showing the configuration of the flip-flop section 7 depicted in FIG. 3.

The data distribution circuit 2 comprises a plurality of flip-flop sections 7. FIG. 5 is a circuit block diagram showing the configuration of each flip-flop section 7. Each flip-flop section 7 is made up of, for example, five flip-flop circuits 8 connected in series. Each flip-flop circuit 8 includes one nonvolatile element and one flip-flop FF.

Resetting signal FCLRIN, setting signal FSETIN and clock signal CLKIN are supplied to the flop-flop section 7. Signal FCLRIN is supplied to buffer BF1. This buffer BF1 includes two inverter circuits IV1 and IV2 connected in series. The buffer BF1 outputs resetting signal FCLR. This signal, FCLR, is supplied to the five flip-flop circuits 8 of the flip-flop section 7, and also to the flip-flop section 7 of the next stage.

Signal FSETIN is supplied to buffer BF2. This buffer BF2 includes two inverter circuits IV3 and IV4 connected in series. The buffer BF2 outputs setting signal FSET. This signal, FSET, is supplied to the flip-flop circuits 8 of the flip-flop section 7, and also to the flip-flop section 7 of the next stage.

Signal CLKIN is supplied to buffer BF3. This buffer BF3 includes two inverter circuits IV5 and IV6 connected in series. Inverter circuit IV5 inverts clock signal CLKIN, thereby producing clock signal CLKB. This clock signal, CLKB, is supplied to the flip-flop circuits 8 of the flip-flop section 7. Buffer BF3 outputs clock signal CLK. This clock signal, CLK, is supplied to the flip-flop circuits 8 of the flip-flop section 7, and also to the flip-flop section 7 of the next stage.

Input data IN is supplied to the flip-flop section 7. In synchronism with the clock signal CLK, the input data IN is shifted, and is produced as output data OUT by the flip-flop section 7.

Figure 6:
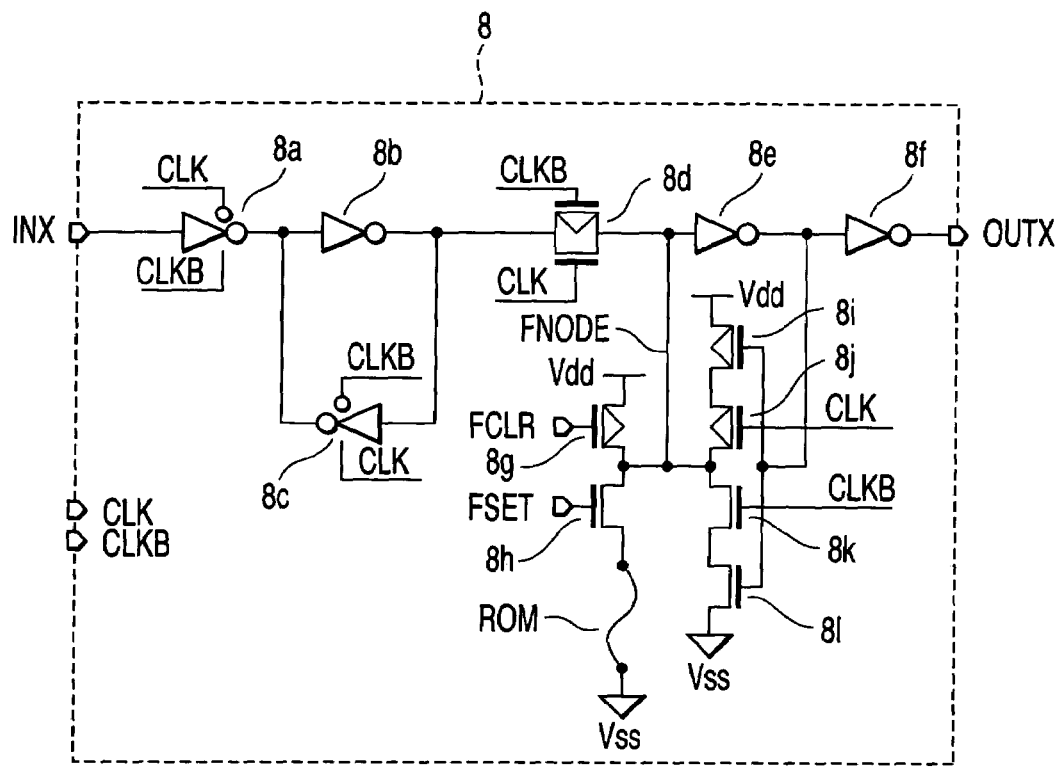
FIG. 6 is a circuit diagram showing the configuration of the flip-flop circuit 8 depicted in FIG. 5.

FIG. 6 is a circuit diagram showing the configuration of the flip-flop circuit 8. The flip-flop circuit 8 comprises clocked inverter circuits 8a and 8c, inverter circuits 8b, 8e and 8f, a transfer gate 8d, N-type MOS transistors 8h, 8k and 8l, P-type MOS transistors 8g, 8i and 8j, and a nonvolatile element ROM. The nonvolatile element is a fuse element, for example.

When clock signal CLK is "0", clocked inverter circuit 8a outputs data obtained by inverting input data INX. When clock signal CLK is "1", clocked inverter circuit 8c outputs data which is obtained by inverting the input data thereto. Inverter circuit 8b and clocked inverter circuit 8c constitute a holding circuit. This holding circuit holds the data output from clocked inverter circuit 8a when clock signal CLK is "1."

Transfer gate 8d is made of an N-type MOS transistor and a P-type MOS transistor that are connected in parallel to each other. When clock signal CLK is "1", transfer gate 8d allows outputting data. The output terminal of the transfer gate 8d is connected to node FNODE. This node is connected to the input terminal of inverter circuit 8e.

Transistors 8i to 8l jointly constitute a clocked inverter circuit. This clocked inverter circuit and inverter circuit 8e constitute a holding circuit. When clock signal CLK is "0", the holding circuit holds the data appearing at node FNODE.

Figure 7:
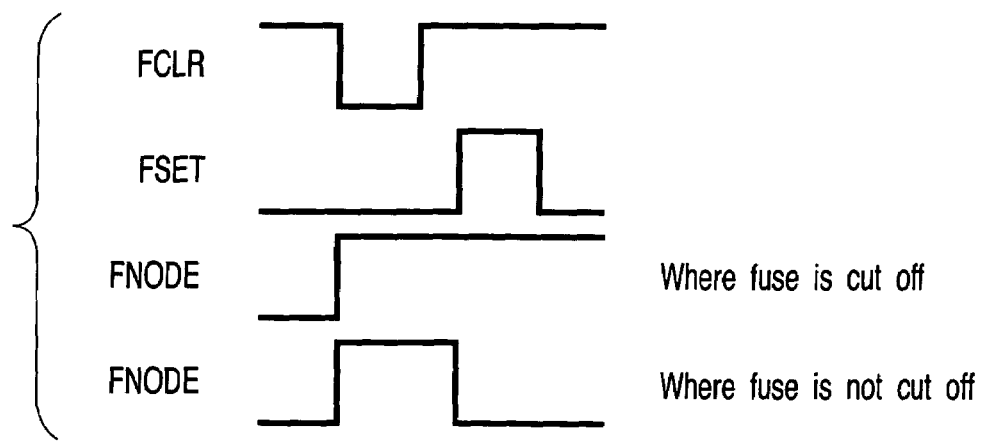
FIG. 7 is a timing chart illustrating an operation of the flip-flop circuit 8.

FIG. 7 is a timing chart illustrating an operation of the flip-flop circuit 8. When signal FCLR is "0" and signal FSET is "0", transistor 8g is turned on and transistor 8h is turned off. In this case, the potential at node FNODE is Vdd (i.e., data "1"). Accordingly, the flip-flop circuit 8 is reset.

When signal FCLR is "1" and signal FSET is "1", transistor 8g is turned off and transistor 8h is turned on. In this case, the potential at node FNODE is the same as the data stored in the nonvolatile element. In other words, where the fuse element is cut off, the data appearing at node FNODE is data "1." Where the fuse element is not cut off, the data appearing at node FNODE is data "0." In this manner, the flip-flop circuit 8 stores the data held in the nonvolatile element.

In synchronism with clock signal, the flip-flop circuit 8 outputs the data held at node FNODE, and the input data supplied to the flip-flop circuit 8 is held at node FNODE. In this manner, the shift register 5 outputs the data stored in each nonvolatile element.

Figure 8:
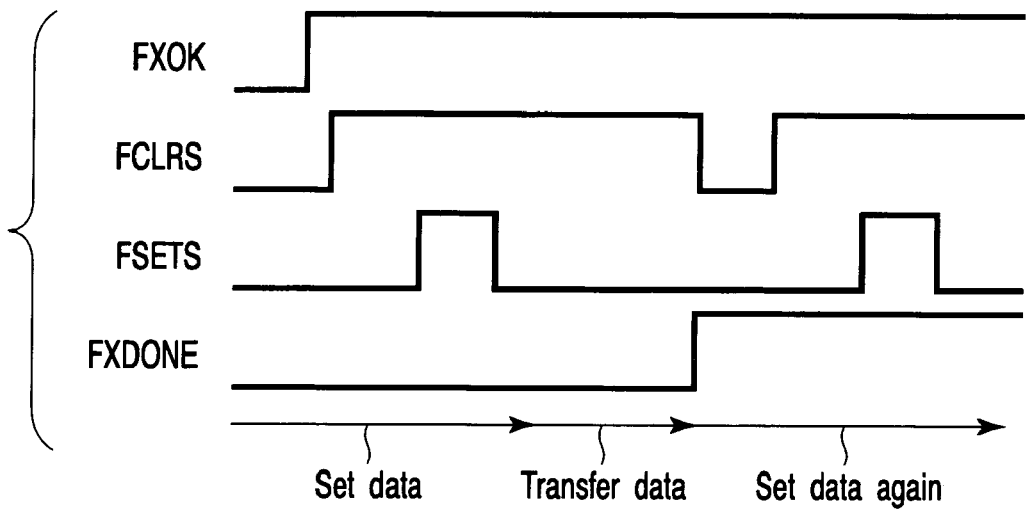
FIG. 8 is a timing chart illustrating an operation of the data distribution apparatus 2.

A description will now be given of how the semiconductor integrated circuit 1 of the above configuration operates. FIG. 8 is a timing chart illustrating an operation of the data distribution apparatus 2.

The data distribution apparatus 2 is supplied with transfer start signal FXOK. Upon receipt of transfer start signal FXOK, the data distribution circuit starts a transfer operation. To be more specific, when signal FXOK changes from "0" to "1", the control section 4 changes resetting signal FCLRS from "0" to "1." As a result, all flip-flops FF are released from the reset state. It should be noted here that flip-flops FF are reset when resetting signal FCLRS is "0" and released from the reset state when resetting signal FCLRS is "1."

After all flip-flops FF are released from the reset state, the control section 4 outputs setting signal FSETS, which is a pulse signal of data "1." This pulse signal is supplied to the flip-flop circuit 8. Upon receipt of it, the flip-flop circuit 8 stores data held in the nonvolatile element. When clock signal CLK is supplied thereafter, the control section 4 transfers data from the shift register 5 to the circuit block group 3.

After the data is transferred to the circuit block group 3, transfer end signal FXDONE is input. To be more specific, signal FXDONE changes from "0" to "1", the control section outputs signal FCLRS, which is a pulse signal of data "0." This pulse signal is supplied to each flip-flop circuit 8. As a result, all flip-flop circuits 8 are reset.

When signal FCLRS changes from "0" to "1", all flip-flops FF are released from the reset state. In response to this, the control section 4 outputs signal FSETS, which is a pulse signal of data "1." This pulse signal is supplied to each flip-flop circuit 8. As a result, each flip-flop circuit 8 stores the data held in the nonvolatile element one more time. When clock signal CLK is externally supplied, the control section 4 outputs external output data EDO from output terminal T1.

A description will now be given as to how external input data EDI is transferred from the data distribution apparatus 2 to the circuit block group 3.

When external input data EDI is input, the control section 4 produces output data DOX corresponding to data EDI and supplies it to the shift register 5. Thereafter, when clock signal CLK is input, the shift register 5 stores output data DOX. When clock signal CLK is input, the control section 4 transfers the data from the shift register 5 to the circuit block group 3.

The operation of the data distribution apparatus 2 is controlled by supplying commands to it. For example, the control section 4 may be so configured as not to perform a data transfer operation despite the receipt of transfer start signal FXOK. Alternatively, the control section may be so configured as to transfer only the data stored in some of the nonvolatile elements. Furthermore, after the data transfer operation, the control section 4 may reset the nonvolatile elements without storing data in them. Still further, the control section 4 may be so designed as to write "0" in all flip-flops FF, or to write "0" and "1" alternately in flip-flops FF.

As detailed above, in the present embodiment, the data stored in the nonvolatile elements are output from the data distribution apparatus 2, and externally input data are transferred to the circuit block group 3.

The present embodiment enables the nonvolatile elements and the shift register to be accessed externally. This leads to improvement of the performance of semiconductor integrated circuits 1 and the improvement of the manufacturing yield.

The data stored in the nonvolatile elements can be externally read out. The readout data may be compared with the data that is used for programming the semiconductor integrated circuit 1 at the time of manufacture, and the results of this comparison can be used for evaluating the nonvolatile elements and the shift register.

The externally input data may be transferred to the circuit block group 3. This transfer operation is useful to the case where the data in the nonvolatile elements are used for redundancy or trimming. This is because there may be a case where the data in the nonvolatile elements need to be rewritten inside the chip after they are used for programming.

Second Embodiment

Figure 9:
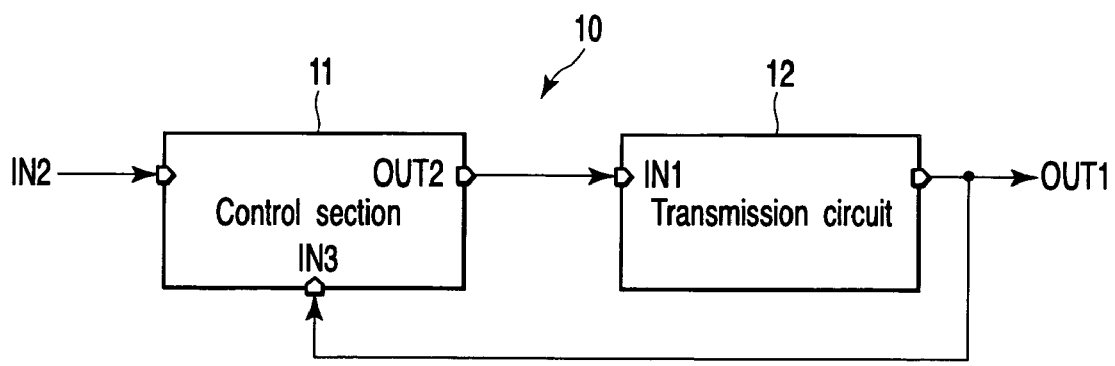
FIG. 9 is a schematic diagram illustrating a semiconductor integrated circuit 10 according, to the second embodiment of the present invention.

FIG. 9 is a schematic diagram illustrating a semiconductor integrated circuit 10 according to the second embodiment of the present invention. The semiconductor integrated circuit 10 comprises a control section 11 and a transmission circuit 12.

Figure 10:
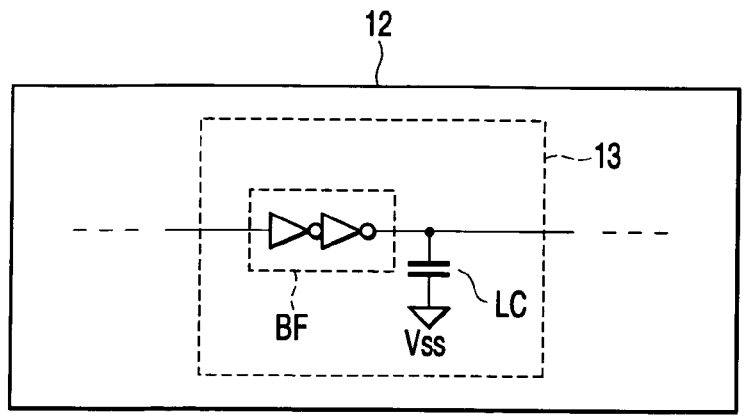
FIG. 10 is a circuit diagram showing the configuration of the transmission circuit 12 depicted in FIG. 9.

FIG. 10 is a circuit diagram showing the configuration of the transmission circuit 12 depicted in FIG. 9. The transmission circuit 12 comprises a plurality of circuits 13 connected in series. The transmission circuit 12 receives input signal IN1 supplied from the control section 11, and produces output signal OUT1. The input signal IN1 is sequentially transmitted to the circuits 13 of the transmission circuit 12.

Each circuit 13 includes a buffer BF and a load capacitance element LC. The buffer BF is made of two inverter circuits, such as a P-type MOS transistor and an N-type MOS transistor. The load capacitance element LC is, specifically, a parasitic capacitance produced in the wiring line of the circuit 13, a gate capacitance produced in the gate electrodes of the transistors of the circuit 13, a junction capacitance produced in the buffer BF, etc.

Input signal IN1 is supplied to the buffer BF. Using the input signal IN1, the buffer BF drives the load capacitance element LC. The buffer BF sends the input signal it receives to the subsequent circuit 13 (i.e., to the buffer BF of the subsequent circuit 13).

The circuit 13 may be any type of circuit as long as it includes a buffer BF supplied with input signal IN1 and operates based on input signal IN1.

Figure 11:
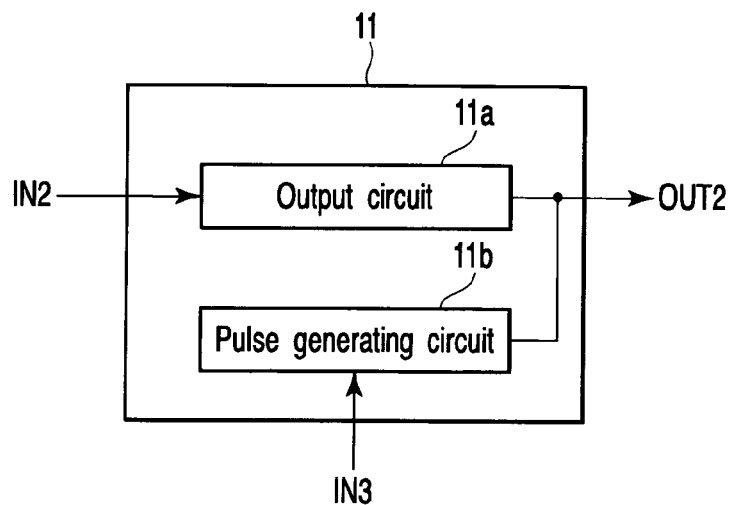
FIG. 11 is a block diagram showing the configuration of the control section 11 depicted in FIG. 9.

FIG. 11 is a block diagram showing the configuration of the control section 11. The control section 11 comprises an output circuit 11a and a pulse generating circuit 11b. The output circuit 11a receives signal IN2 and outputs the same signal as signal OUT2. Based on signal IN3 supplied from the transmission circuit 12, the pulse generating circuit 11b inverts the polarity of signal IN2. As can be seen from this, the control section produces pulse signals on the basis of signals IN2 and IN3.

Figure 12:
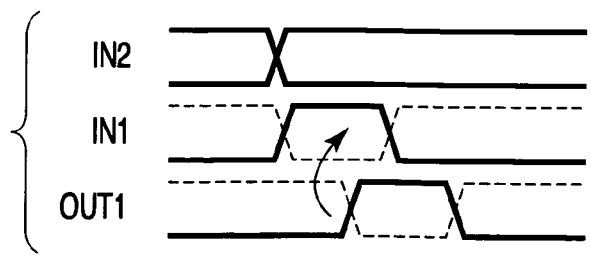
FIG. 12 is a timing chart illustrating an operation of the semiconductor integrated circuit 10.

A description will now be given of an operation of the semiconductor integrated circuit of the above configuration. FIG. 12 is a timing chart illustrating the operation of the semiconductor integrated circuit 10. First of all, signal IN2 indicating the start of pulse transmission is supplied to the control section 11. The polarity of signal IN2 is predetermined. In response to signal IN2, the control section 11 outputs signal OUT2. Signal OUT2 is supplied to the transmission circuit 12 as signal IN1. After rising (falling), signal IN1 is transmitted through the circuits 13 of the transmission circuit 12. When signal IN1 is transmitted to the circuit 13 of the last stage, the transmission circuit 12 produces signal OUT1.

The control section 11 receives the signal OUT1 produced from the transmission circuit 12. The signal OUT1 is received as signal IN3. Upon receipt of this signal, the control section lowers the level of signal OUT2 (raises the level of signal OUT2). After this, signal OUT1 falls (rises).

As detailed above, the present embodiment is featured in that signal IN1 rises in response to the rise of signal IN2, which indicates the start of transmission. Using signal OUT1 output from the transmission circuit 12, signal IN1 is lowered in level.

The present embodiment is advantageous in that pulse signals for driving the circuits 13 (load capacitance elements) can be transmitted to the circuits 13 without fail. Hence, all load capacitance elements LC can be reliably driven.

To enable the pulse signals to have a sufficient margin, a delay element may be used. The use of the delay element provides a long time between the reception of signal IN3 and the falling (rising) of signal OUT2. This configuration is effective in providing a pulse width corresponding to the length of time delayed by the delay element. It is therefore possible to properly determine the pulse width in accordance with the number of circuits 13 incorporated in the transmission circuit.

Third Embodiment

The third embodiment is obtained by applying the transmission system described in relation to the second embodiment to the first embodiment.

Figure 13:
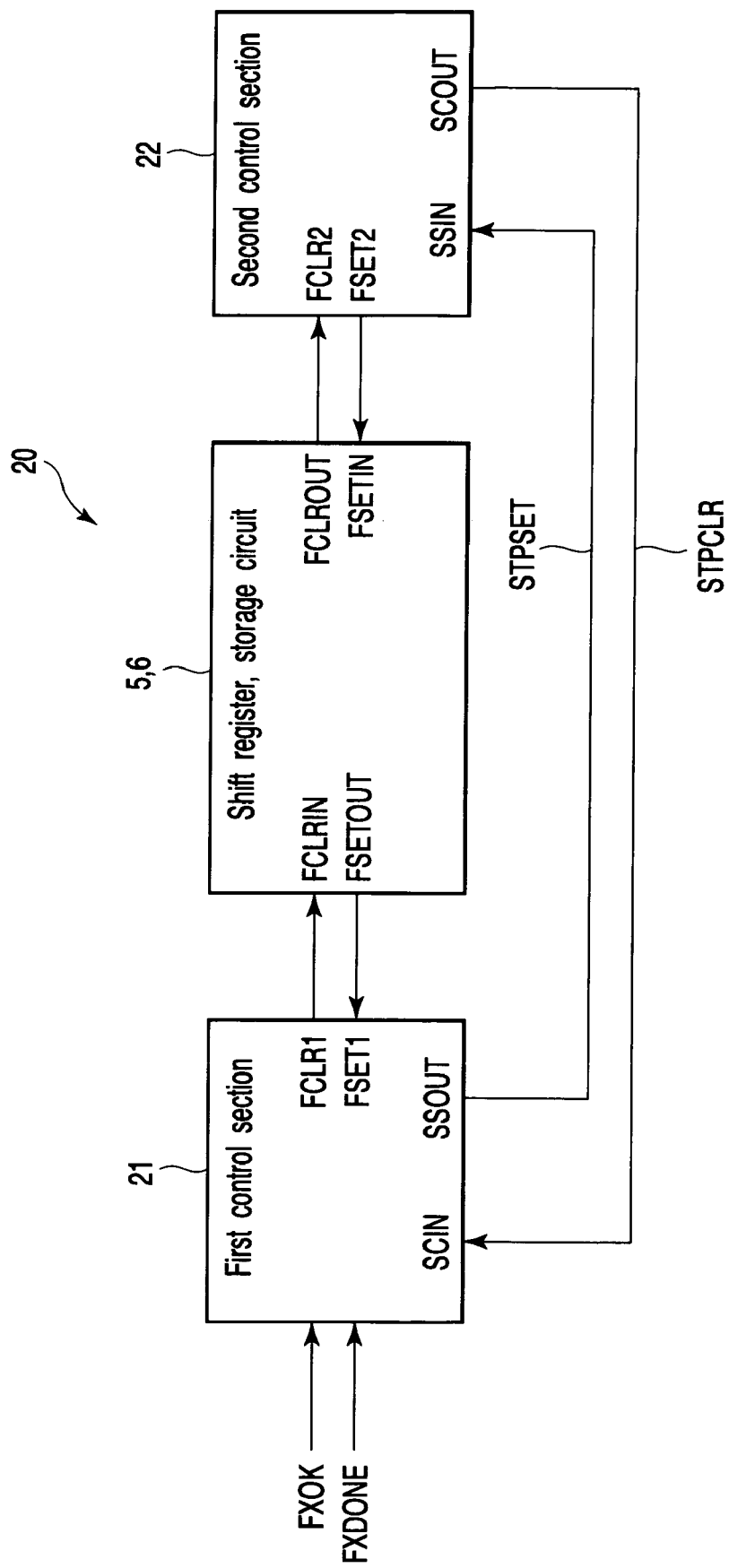
FIG. 13 is a schematic diagram illustrating a semiconductor integrated circuit 20 according to the third embodiment of the present invention.

FIG. 13 is a schematic diagram illustrating a semiconductor integrated circuit 20 according to the third embodiment of the present invention. A semiconductor integrated circuit 20 comprises a first control section 21, a second control section 22, a shift register 5 and a storage circuit 6. The first and second control sections 21 and 22 are connected to each other by means of signal line STPSET and signal line STPCLR.

Illustration of a circuit block group 3 to which data is supplied is omitted. Each of the first and second control sections 21 and 22 is provided with an output circuit 4a, a transfer circuit 4d, an input circuit 4e and a command decode circuit 4f (none of which is shown).

The first control section 21 receives transfer start signal FXOK and transfer end signal FXDONE. The first control section 21 supplies signal FCLR1 to the shift register 5. The shift register 5 receives the signal FCLR1 as signal FCLRIN. The first control section 21 supplies signal SSOUT to the second control section 22. The second control section 22 receives signal SSOUT as signal SSIN.

The second control section 22 supplies signal FSET2 to the shift register 5. The shift register 5 receives signal FSET2 as FSETIN. The second control section 22 supplies signal SCOUT to the first control section 21. The first control section 21 receives signal SCOUT as signal SCIN.

Signal FSETIN is transmitted sequentially to the flip-flop sections 7 of the shift register 5. When signal FSETIN has been transmitted to all flip-flop sections 7, the shift register 5 supplies signal FSETOUT to the first control section 21. The first control section 21 receives signal FSETOUT as signal FSET1.

Signal FCLRIN is transmitted sequentially to the flip-flop sections 7 of the shift register 5. When signal FCLRIN has been transmitted to all flip-flop sections 7, the shift register 5 supplies signal FCLROUT to the second control section 22. The second control section 22 receives signal FCLROUT as signal FCLR2.

FIG. 14 is a block diagram showing the configuration of the first control section 21 depicted in FIG. 13. The first control section 21 comprises a first resetting signal-generating circuit 21a and a first setting signal-generating circuit 21b. The first resetting signal-generating circuit 21a receives signal FXOK, signal FXDONE and signal SCIN. The first resetting signal-generating circuit 21a outputs signal FCLR1.

The first setting signal-generating circuit 21b receives signal FSET1 and outputs signal SSOUT.

FIG. 15 is a block diagram showing the configuration of the second control section 22 depicted in FIG. 13. The second control section 22 comprises a second resetting signal-generating circuit 22a and a second setting signal-generating circuit 22b. The second resetting signal-generating circuit 22a receives signal FCLR2 and outputs signal SCOUT.

The second setting signal-generating circuit 22b receives signal FCLR2 and signal SSIN and outputs signal FSET2.

The first resetting signal-generating circuit 21a and the second resetting signal-generating circuit 22a produce pulse signals whose polarity is negative ("1"→"0"→"1"). The first setting signal-generating circuit 21b and the second setting signal-generating circuit 22b produce pulse signals whose polarity is positive ("0"→"1"→"0").

In the present embodiment, the setting and resetting operations are controlled by two control sections (namely, the first control section 21 and the second control section 22). Needless to say, these control sections may be realized as one block. In this case, the first resetting signal-generating circuit 21a and the second resetting signal-generating circuit 22a are realized as one block, and the first setting signal-generating circuit 21b and the second setting signal-generating circuit 22b are also realized as one block.

Figure 16:
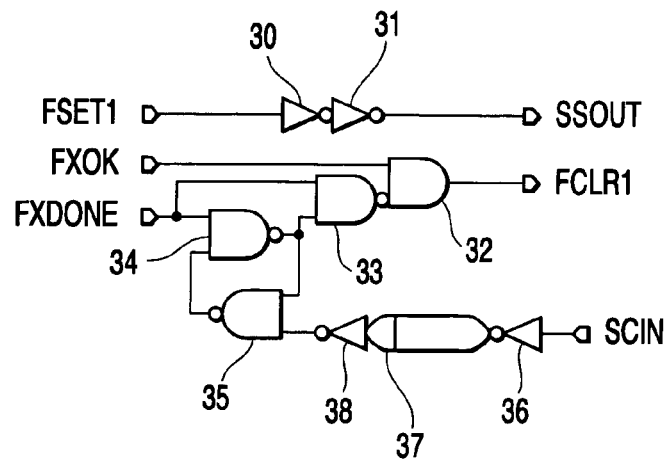
FIG. 16 is a circuit diagram showing a specific configuration of the first control section 21 depicted in FIG. 14.

FIG. 16 is a circuit diagram showing a specific configuration of the first control section 21 depicted in FIG. 14. The first control section 21 comprises inverter circuits 30, 31, 36 and 38, an AND circuit 32, NAND circuits 33, 34 and 35, and a delay element 37. NAND circuits 34 and 35 jointly constitute a holding circuit. This holding circuit holds the data from inverter circuit 38 when signal FXDONE becomes "1." After being held, the data is output to NAND circuit 33. The delay element 37 receives the signal supplied from inverter circuit 36, delays the rising of this signal for a predetermined time, and then outputs it. The delay time can be arbitrarily determined in accordance with the number of flip-flops FF included in the shift register 5.

Figure 17:
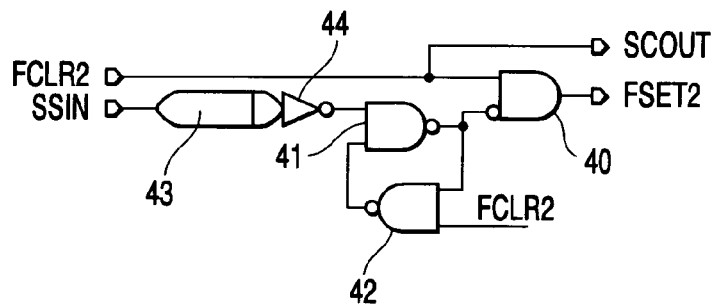
FIG. 17 is a circuit diagram showing a specific configuration of the second control section 22 depicted in FIG. 15.

FIG. 17 is a circuit diagram showing a specific configuration of the second control section 22 depicted in FIG. 15. The second control section 22 comprises an AND circuit 40, NAND circuits 41 and 42, a delay element 43 and an inverter circuit 44. NAND circuits 41 and 42 jointly constitute a holding circuit. This holding circuit holds the data from inverter circuit 44 when signal FCLROUT (FCLR2) becomes "1." After being held, the data is output. The delay element 43 delays the rising of signal SSIN for a predetermined time and then outputs it.

Figure 18:
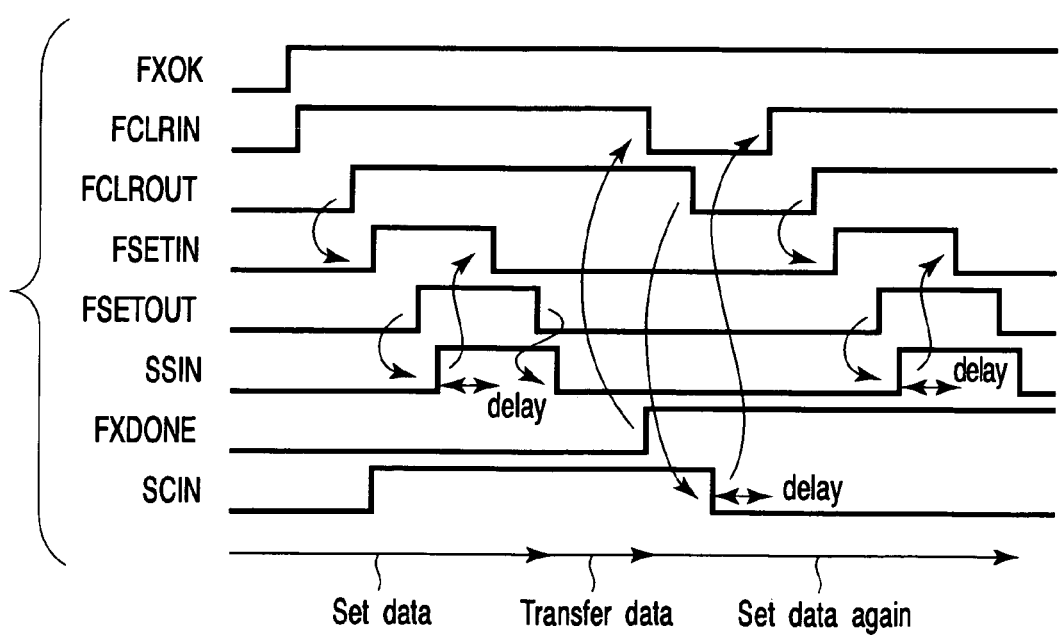
FIG. 18 is a timing chart illustrating an operation of the semiconductor circuit 20.

A description will now be given as to how the semiconductor integrated circuit 20 operates. FIG. 18 is a timing chart illustrating the operation of the semiconductor circuit 20. First of all, signal FXOK rises, and in response thereto, the first control section 21 raises the level of signal FCLRIN. When this signal, FCLRIN, is transmitted to signal FCLROUT (i.e. the signal FCLRIN is output from the shift register 5 as the signal FCLROUT), all flip-flops FF are released from the reset state.

In response to the rising of signal FCLROUT, the second control circuit 22 raises the level of signal FSETIN. Simultaneous with this, the second control section 22 raises the level of signal SCOUT (SCIN). When signal FSETIN is transmitted to signal FSETOUT, the first control section 21 raises the level of signal SSOUT (SSIN). Upon reception of signal SSIN, the second control section 22 lowers the level of signal FSETIN. Signal FSETIN is transmitted to signal FSETOUT.

As a result of the above operation, the data in all nonvolatile elements is set in flop-flops FF. Then, the data is transferred to the circuit block group 3.

After the data transfer operation, signal FXDONE rises. In response to signal FXDONE, the first control section 21 lowers the level of signal FCLRIN. When this signal, FCLRIN, is transmitted to signal FCLROUT, the second control section 22 lowers the level of signal SCOUT (SCIN). Upon receipt of signal SCIN, the first control section 21 raises the level of signal FCLRIN.

Thereafter, the data in the nonvolatile elements is set in flip-flops FF once again, as it was at the start of the data transfer operation. After resetting all flip-flops FF at the end of the data transfer operation in this manner, the data in the nonvolatile elements can be set in the flop-flops FF.

The time between the rise of signal SSIN and the fall of signal FSETIN is provided by the delay element 43. This enables the pulse signals of signal FSETIN to have a sufficient margin. The time between the fall of signal SCIN and the rise of signal FCLRIN is provided by the delay element 37. This enables the pulse signals of signal FCLRIN to have a sufficient margin.

As described above, the present embodiment enables pulse signals, used for setting or resetting the shift registers 5, to be transmitted to all flip-flops FF of the shift register 5. Hence, the flip-flops can set or reset data in a reliable manner.

In addition, since the delay element is used for ensuring a sufficient pulse width, the pulse signals have a sufficient margin.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device for transferring first data to a circuit block, comprising:
   a storage circuit configured to store the first data;
   a shift register configured to set the first data;
   a transfer circuit configured to transfer the first data from the shift register to the circuit block;
   a first input terminal configured to receive a first signal indicating the end of a transfer operation;
   a resetting signal-generating circuit configured to generate a resetting signal for resetting the shift register based on the first signal;
   a setting signal-generating circuit configured to generate a setting signal for setting the first data in the shift register again after the shift register is reset; and
   an output circuit configured to externally output the first data that has been set again.

2. The semiconductor device according to claim 1, further comprising:
   an input circuit configured to receive second data externally input thereto and to supply the second data to the shift register,
   the shift register setting the second data.

3. The semiconductor device according to claim 2, further comprising:
   a command decode circuit configured to receive a command for transferring the second data and to cause the transfer circuit to transfer the second data based on the command.

4. The semiconductor device according to claim 1, wherein the storage circuit includes a plurality of storage elements corresponding in number to pieces of the first data.

5. The semiconductor device according to claim 4, wherein the shift register includes: a plurality of flip-flops corresponding to the storage elements, respectively, and connected in series with one another; a plurality of first buffer circuits corresponding to flip-flop groups which include at least one of the flip-flops, respectively, and configured to transmit the resetting signal; and a plurality of second buffer circuits corresponding to the flip-flop groups and configured to transmit the setting signal.

6. The semiconductor device according to claim 5, wherein the resetting signal-generating circuit enables the resetting signal when the first signal is supplied, and disables the resetting signal after the resetting signal is transmitted to each of the flip-flops.

7. The semiconductor device according to claim 6, wherein the setting signal-generating circuit enables the setting signal when the resetting signal is disabled, and disables the setting signal after the setting signal is transmitted to each of the flip-flops.

8. The semiconductor device according to claim 1, further comprising:
   a clock terminal configured to receive a clock signal,
   the shift register operating based on the clock signal.

9. The semiconductor device according to claim 4, wherein the storage elements are nonvolatile and programmable only once.

10. The semiconductor device according to claim 5, wherein each of the first and second buffer circuits includes two inverter circuits connected in series.

11. The semiconductor device according to claim 1, wherein the first data is trimming data based on which the circuit block performs trimming, or redundancy data based on which the circuit block performs redundancy.

12. A semiconductor device comprising:
   a storage circuit configured to store first data;
   a shift register configured to set or reset the first data;
   a first resetting signal-generating circuit configured to generate a resetting signal for resetting the shift register; and
   a second resetting signal-generating circuit configured to generate a first detection signal indicating that the shift register has been reset after the resetting signal is transferred to the shift register,
   the first resetting signal-generating circuit disabling the resetting signal based on the first detection signal.

13. The semiconductor circuit according to claim 12, further comprising:
   a first setting signal-generating circuit configured to generate a setting signal for setting the shift register; and
   a second setting signal-generating circuit configured to generate a second detection signal indicating that the shift register has been set after the setting signal is transferred to the shift register,
   the first setting signal-generating circuit disabling the setting signal based on the second detection signal.

14. The semiconductor device according to claim 13, wherein the storage circuit includes a plurality of storage elements corresponding in number to pieces of the first data.

15. The semiconductor device according to claim 14, wherein the shift register includes: a plurality of flip-flops corresponding to the storage elements, respectively, and connected in series with one another; a plurality of first buffer circuits corresponding to flip-flop groups which include at least one of the flip-flops, respectively, and configured to transmit the resetting signal; and a plurality of second buffer circuits corresponding to the flip-flop groups and configured to transmit the setting signal.

16. The semiconductor device according to claim 12, further comprising:
   a clock terminal configured to receive a clock signal, the shift register operating based on the clock signal.

17. The semiconductor device according to claim 15, wherein each of the first and second buffer circuits includes two inverter circuits connected in series.

* * * * *